(12) United States Patent
Kawaguchi et al.

(10) Patent No.: US 8,380,080 B2
(45) Date of Patent: Feb. 19, 2013

(54) OPTICAL TRANSCEIVER

(75) Inventors: Toshiyuki Kawaguchi, Tokyo (JP);
Kazutoki Tahara, Saitama (JP);
Tsutomu Saga, Saitama (JP)

(73) Assignee: Shin-Etsu Polymer Co., Ltd. (JP)

( * ) Notice: Subject to any disclaimer, the term of this patent is extended or adjusted under 35 U.S.C. 154(b) by 594 days.

(21) Appl. No.: 12/554,251

(22) Filed: Sep. 4, 2009

(65) Prior Publication Data

US 2010/0061736 A1 Mar. 11, 2010

(30) Foreign Application Priority Data

Sep. 9, 2008 (JP) ................. P2008-230978

(51) Int. Cl.
*H04B 10/12* (2006.01)
*H04B 10/00* (2006.01)

(52) U.S. Cl. .............. 398/164; 398/135; 398/138

(58) Field of Classification Search .......... 398/164, 398/135–139
See application file for complete search history.

(56) References Cited

U.S. PATENT DOCUMENTS

| 4,886,699 A * | 12/1989 | Carroll et al. ............ 442/235 |
| 2005/0045374 A1* | 3/2005 | Kumar et al. ............ 174/254 |
| 2007/0126524 A1* | 6/2007 | Yagisawa ................. 333/33 |
| 2008/0049410 A1* | 2/2008 | Kawaguchi et al. ......... 361/818 |
| 2010/0201459 A1* | 8/2010 | Kawaguchi et al. ......... 333/204 |
| 2011/0147053 A1* | 6/2011 | Kawaguchi et al. ......... 174/254 |

FOREIGN PATENT DOCUMENTS

| CN | 1412960 A | 4/2003 |
| CN | 1441499 A | 9/2003 |
| CN | 1920606 A | 2/2007 |
| JP | 2006-294967 | 10/2006 |
| JP | 2007-043496 | 2/2007 |
| JP | 2007-048822 | 2/2007 |

OTHER PUBLICATIONS

Office Action dated Aug. 31, 2012 issued in corresponding Chinese Patent Application No. 200910171685.5 with English translation (8 pages).
Japanese Office Action, dated Nov. 6, 2012, issued in corresponding Japanese Patent Application No. 2008-230978, including English translation. Total 6 pages.

* cited by examiner

*Primary Examiner* — Kenneth N Vanderpuye
*Assistant Examiner* — Daniel Dobson
(74) *Attorney, Agent, or Firm* — Ostrolenk Faber LLP

(57) ABSTRACT

An optical transceiver of the present invention comprising an OSA, a circuit board, and a flexible substrate connecting these, in which the flexible substrate has high-speed signal lines and other lines other than the high speed signal lines provided separated from each other on the same surface, a ground layer placed apart and opposite these, and a resistive layer placed apart and opposite the high-speed signal lines, the other lines and the ground layer. High-speed signal and the resistive layer are opposite at least a part of the other lines.

4 Claims, 10 Drawing Sheets

OPTICAL TRANSCEIVER

BACKGROUND OF THE INVENTION

1. Field of the Invention

The present invention relates to an optical transceiver for transmitting and receiving an optical signal.

The present application claims priority based on Japanese Patent Application No. 2008-230978, filed in Japan on Sep. 9, 2008, the content of which is incorporated herein by reference.

2. Description of Related Art

Normally, optical transceivers include a transmitter optical sub-assembly (TOSA) for receiving an electric signal to convert into an optical signal and a receiver optical sub-assembly (ROSA) for receiving an optical signal to convert into an electric signal, a LD driver for generating an electric signal to the TOSA, a circuit board mounted with a limiter amplifier or the like for amplifying an electric signal from the ROSA, and a flexible substrate connecting the TOSA and the ROSA with the circuit board (for example refer to Japanese Laid-Open Patent Application No. 2007-043496).

The TOSA and the ROSA are assembled products in which a laser diode (LD), which is a light-emitting element, or a photo diode (PD), which is light-receiving element, and other parts are integrated. Such assembled product is called an optical sub-assembly (OSA).

The flexible substrate has high-speed signal lines for transmitting an electric signal between the TOSA or the ROSA and the circuit board, other lines other than the high-speed signals such as power supply lines for supplying power to the TOSA or the ROSA, and a ground layer.

Recently, signal transmission speed in optical communication is improving. Also, with the improvement in signal transmission speed, there is an increase in the frequency of electric signals transmitted by the high speed signal lines of an optical transceiver. However, there is the problem that unnecessary high-frequency current generated when a semiconductor element or the like supplies a high-frequency signal to a high-speed signal line or the unnecessary high-frequency current generated as a result of resonance or the like by reflection in impedance mismatching places of the high-speed signal line flows into other lines such as a power supply line, becoming high-frequency conduction noise, which has an adverse effect on high-frequency signals or the like transmitted by high-speed signal lines.

SUMMARY OF THE INVENTION

The present invention provides an optical transceiver in which high-frequency conduction noise conducted in other lines other than high-speed signal lines of a flexible substrate is suppressed. Also, the present invention further provides an optical transceiver with little deterioration in high-frequency signals transmitted by the high-speed signal lines.

A first aspect of the present invention is an optical transceiver which includes an optical sub-assembly, a circuit board, and a flexible substrate connecting the optical sub-assembly and the circuit board, wherein the flexible substrate includes, provided spaced apart from each other, high-speed signal lines for transmitting a high-frequency signal, lines other than the high-speed signal lines, a ground layer, and resistive layers, and the resistive layers are opposite at least a part of the lines other than the high-speed signal lines.

A second aspect of the present invention is the optical transceiver according to the first aspect, wherein the resistive layers are not opposite the high-speed signal lines.

A third aspect of the present invention is the optical transceiver according to the first aspect, wherein the flexible substrate is arranged so as to be folded back midway, and the high-speed signal lines of the part of the flexible substrate folded back and opposite is not opposite the resistive layers of a part of the flexible substrate which is not folded back and opposite.

A fourth aspect of the present invention is the optical transceiver according to the first aspect, wherein the resistive layers are opposite near edge sections of the lines other than the high-speed signal lines.

A fifth aspect of the present invention is the optical transceiver according to the first aspect, wherein the lines other than the high-speed signal lines are divided into a plurality of wires in parts opposite the resistive layers.

The optical transceiver of the present invention suppresses high-frequency conduction noise conducted in the other lines other than the high-speed signal lines of the flexible substrate. Also, deterioration in the high-frequency signal transmitted by a high-speed signal line is small if the resistive layers and the high-speed signal lines are not opposite each other.

DESCRIPTION OF THE PREFERRED EMBODIMENTS

In the present specification, "opposite" means the state in which at least a part is overlapping when viewed from a direction perpendicular to the surface of the flexible substrate.

<Optical Transceiver>

The optical transceiver normally includes a TOSA for receiving an electric signal to convert into an optical signal, a ROSA for receiving an optical signal to convert into an electric signal, a LD driver for generating an electric signal to the TOSA, a circuit board mounted with a limiter amplifier or the like for amplifying an electric signal from the ROSA, a first part of flexible substrate for connecting the TOSA and the circuit board, and a second part of a flexible substrate for connecting the ROSA and the circuit board.

Figure 1:
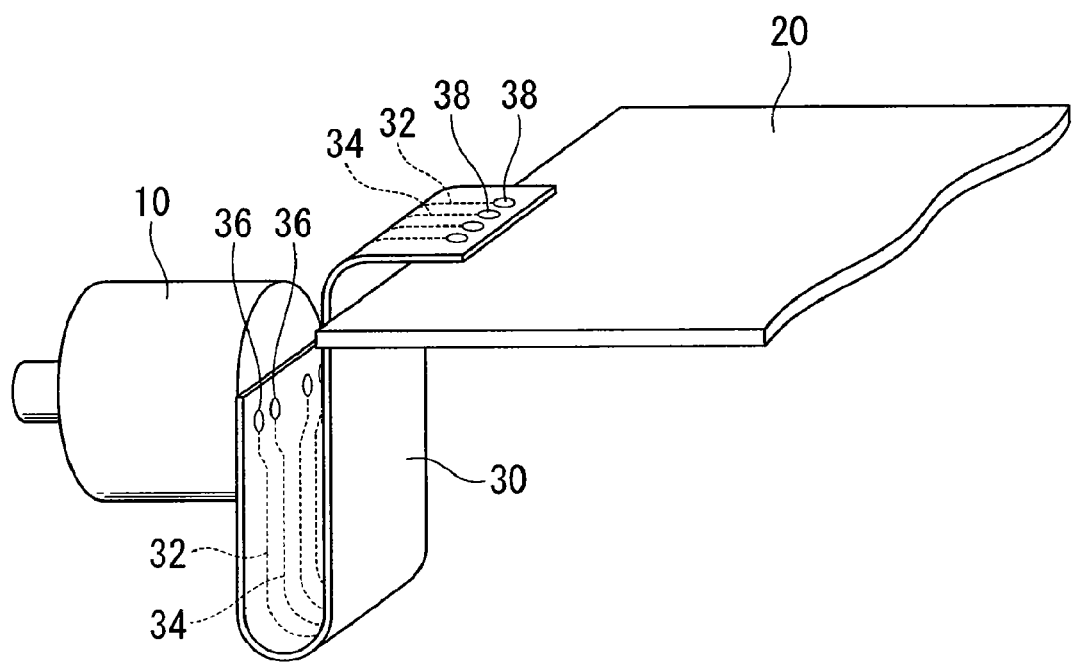
FIG. 1 is a perspective view showing an example of the connection state between an optical sub-assembly and a circuit board in an optical transceiver.

FIG. 1 is a perspective view showing an example of the connection state of an OSA and the circuit board in the optical transceiver. An OSA 10 and a circuit board 20 are connected by a flexible substrate 30 in which the side connected to the OSA 10 is folded back at an angle of approximately 180 degrees and the side connected to the circuit board 20 is bent about 90 degrees. Although there is only one OSA in the drawings, normally two OSA (TOSA and ROSA) are connected to one circuit board.

With respect to connection on the OSA 10 side, lead pins (not shown) projecting from the OSA 10 are inserted into through holes 36 provided in one end of the high-speed signal lines 34 and other lines 32 other then the high speed signal lines (hereinafter simply referred to as "other lines") of the flexible substrate 30, and fixed by solder or the like.

With respect to connection on the circuit board 20 side, lead pins (not shown) projecting from the circuit board 20 are inserted into through holes 38 provided in the other end of the high-speed signal lines 34 and the other lines 32 of the flexible substrate 30, and fixed by solder or the like.

(OSA)

Examples of the OSA 10 include a TOSA, a ROSA, an optical transmitting/receiving sub-assembly provided with both a LD and a PD and provided with an optical wavelength filter for multiplexing/demultiplexing to the LD and PD optical signals having different up and down wavelengths, and the like.

(Circuit Board)

Examples of the circuit board 20 include an LD driver (not shown) for generating an electric signal to the TOSA, a rigid substrate mounted with a limiter amplifier or the like for amplifying an electric signal from the ROSA, and the like.

(Flexible Substrate)

Figure 2:
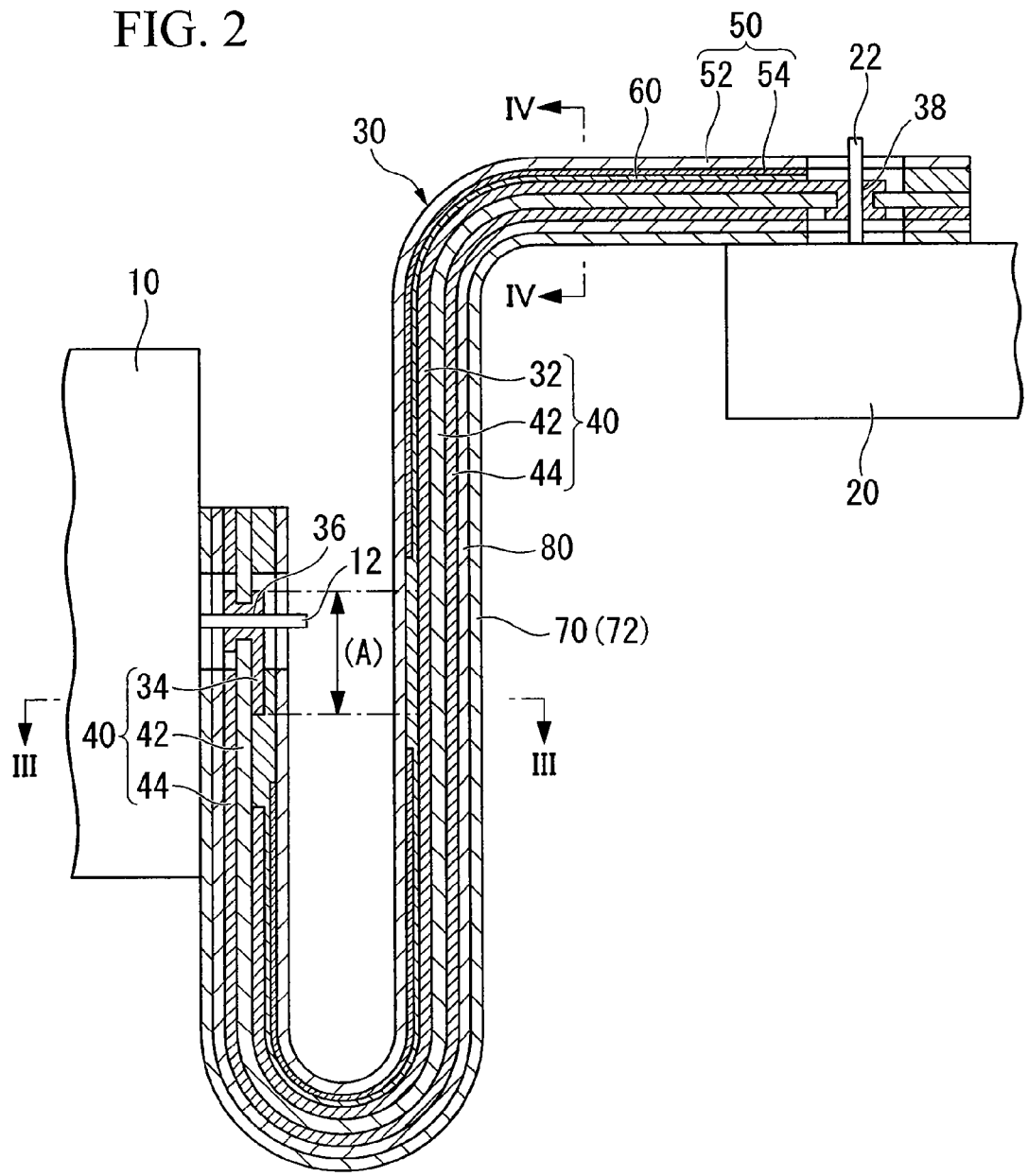
FIG. 2 is a cross-sectional view when the flexible substrate in FIG. 1 is cut in the lengthwise direction.
Figure 3:
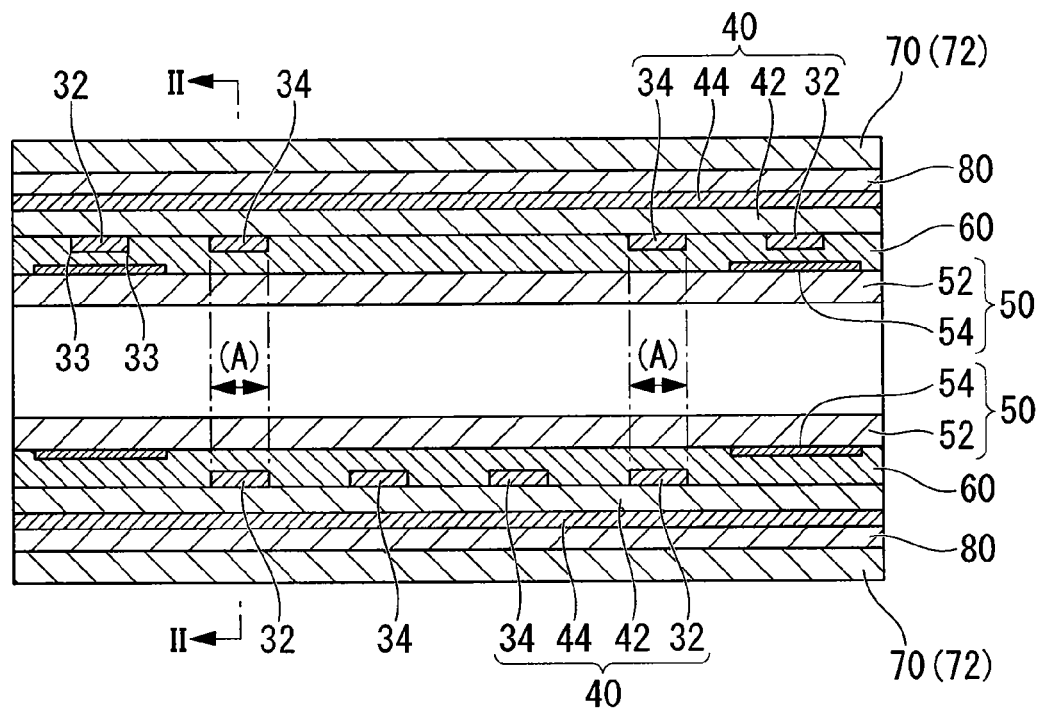
FIG. 3 is a cross-sectional view along III-III in FIG. 2.
Figure 4:
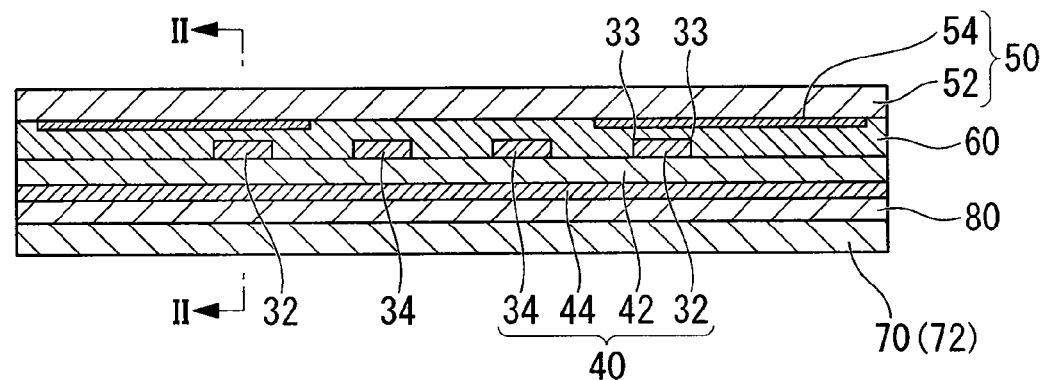
FIG. 4 is a cross-sectional view along IV-IV in FIG. 2.

FIG. 2 is a cross-sectional view when the flexible substrate 30 is cut in the lengthwise direction, FIG. 3 is a cross-sectional view along III-III in FIG. 2, and FIG. 4 is a cross-sectional view along IV-IV in FIG. 2. The flexible substrate 30 has a first coverlay film 50 bonded to one surface of a substrate body 40 via an adhesive layer 60 and a second coverlay film 70 bonded to the other surface of the substrate body 40 via an adhesive layer 80.

The width of the flexible substrate 30 is about 6 mm, which is equivalent to the diameter of the OSA. The length of the flexible substrate 30 is preferably short in order to prevent deterioration of high-frequency signals as much as possible and is about 10 mm.

The high-speed signal lines 34 have a microstrip structure or coplanar structure having good transmission characteristics by a ground layer 44 and/or a ground line being placed opposite and spaced apart.

(Substrate Body)

The substrate body 40 has a base material film 42, the high-speed signal lines 34 and the other line 32 provided spaced apart from each other on one surface of the base material film 42, and the ground layer 44 placed opposite and spaced apart from the high-speed signal lines 34 and the other lines 32 on the other surface of the base material film 42.

The substrate 40 is conductors (high-speed signal lines 34, other lines 32, and ground layer 44) provided by processing the copper foil of a copper-clad laminate by a well-known etching method to give a desired pattern.

Examples of the copper-clad laminate include a product in which the copper foil is bonded to the base material film 42 by an adhesive, a product in which a resin solution or the like forming the base material film 42 is cast on the copper foil, and the like.

(Base Material Film)

Examples of the material of the base material film 42 include PET (polyethylene terephthalate), PEN (polyethylene naphthalate), PC (polycarbonate), polyvinylidene, polyimide, polyphenylene sulfide, liquid crystal polymers, and the like.

The surface resistance of the base material film 42 is preferably $1 \times 10^6 \Omega$ or above.

The thickness of the base material film 42 is preferably 5 to 50 μm, and from the point of flexibility, is more preferably 6 to 25 μm and particularly preferably 10 to 25 μm.

(Conductors)

The high-speed signal lines 34 are lines for transmitting a high-frequency signal of 1 GHz or more. The frequency of the high-frequency signal is preferably 3 GHz or more, more preferably 10 GHz or more, and particularly preferably 40 GHz or more.

The other lines 32 are lines other than the high-speed signal lines 34. Examples of the other lines 32 include power supply lines, line-shaped ground lines, low-speed signal lines for transmitting signals having a lower frequency than the high-speed signal lines 34 (bias voltage suppression lines, suppression lines for optical power monitoring, and the like), and the like.

Examples of the copper foil forming the conductors (high-speed signal lines 34, other lines 32, and ground layer 44) include rolled copper foil, electrolytic copper foil, and the like and from the viewpoint of flexibility, rolled copper foil is preferable.

The thickness of the conductors is preferably 18 to 35 μm.

In end sections (terminals) in the length direction of the high-speed signal lines 34 and the other lines 32, through holes 36 and through holes 38, in which lead pins 12 projecting from the OSA 10 or lead pins 22 projecting from the circuit board 20 are inserted and fixed by solder or the like, are formed.

Thus, such end sections are not covered by the first coverlay film 50 and the second coverlay film 70.

(Coverlay Films)

The first coverlay film 50 has resistive layers 54 formed on one surface of a base film 52.

The second coverlay film 70 is formed from the base material film 72 and resistive layers 54 are not formed.

(Base Material Films)

Examples of the material of the base material film 52 and the base material film 72 include polyimide, liquid crystal polymers, polyaramid, polyphenylene sulfide, polyamide imide, polyether imide, polyethylene naphthalate, polyethylene terephthalate, and the like.

The surface resistance of the base material film 52 and the base material film 72 is preferably $1 \times 10^6 \Omega$ or above.

The thickness of the base material film 52 and the base material film 72, from the point of transmissibility, is preferably 3 to 25 μm, and, from the point of increasing conformability to surface shape, is particularly preferably 3 to 10 μm.

(Resistive Layers)

Although the resistive layers 54 are separated from the other lines 32 via the adhesive layer 60 and are placed opposite near the other lines 32 along the other lines 32, they are not electrically connected to the other lines 32.

In the other lines 32, since high-frequency current (conduction noise) flows concentrating on the surface by the skin effect, high-frequency current flows concentrating on ridge sections (edge sections 33) where the side surfaces and the upper surface or the lower surface intersect. Thus, electromagnetic noise is emitted from the edge sections 33 and electromagnetic field fluctuation occurs around the edge sections 33. It is considered that when this electromagnetic field fluctuation, in other words, variation in the magnetic flux density arising from the edge section 33, occurs, overcurrent is generated in the resistive layer 54 positioned near so as to prevent change in this magnetic flux (principle of electromagnetic induction), energy is consumed by ohmic dissipation, and conduction noise flowing in the other lines 32 is attenuated (conduction noise is suppressed).

There is a possibility that high-frequency signals transmitted by the high-speed signal lines 34 deteriorate since the resistive layers 54 suppress the high-frequency component. Thus, the resistive layers 54 are not placed opposite near the high-speed signal lines 34 without the presence of other conductors (power supply line, ground layer, and the like) other than the high-speed signal lines 34. However, when other conductors are present between the resistive layers 54 and the high-speed signal lines 34, there is no deterioration in high-frequency signals transmitted by the high-speed signal lines 34 since the above-mentioned mechanism of conduction noise suppression does not work. Thus, the resistive layers 54 may be placed opposite the high-speed signal lines 34 when other conductors are present.

Also, considering the above-mentioned mechanism of conduction noise suppression, it is preferable for the resistive layers 54 to be placed opposite the entirety of the other lines 32 excluding the through holes of the end sections. However, the resistive layers 54 are not placed opposite a part of the other lines 32 in a situation like below.

Figure 5:
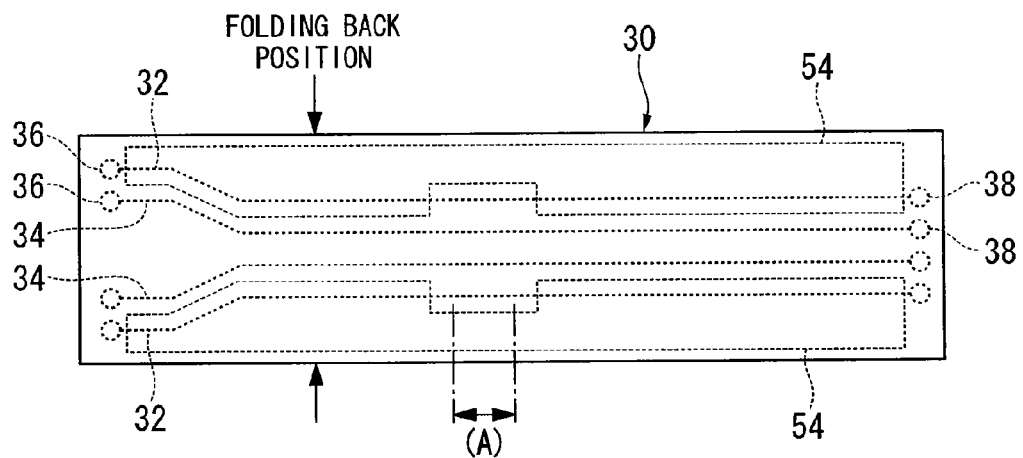
FIG. 5 is a front view of the flexible substrate in FIG. 1.

When the distance between lead pins 12 projecting from the OSA 10 and the distance between lead pins 22 projecting from the circuit board 20 is different, as shown in FIG. 5, the position of the high-speed signal lines 34 and the other lines 32 in the flexible substrate 30 vary midway in the width direction. Also, when such position varies around the part (folding back position in the drawing) where the flexible substrate 30 is folded back at approximately 180 degrees, there is the situation where the high-speed signal lines 34 and the lead pins 12 of the edge section of one part of the folded back and opposite flexible substrate 30 is opposite the other lines 32 of the other part of the flexible substrate 30. In this situation, as shown in FIGS. 2, 3, and 5, it is preferable to not place the resistive layers 54 opposite the other lines 32 in a region (A), which is a region in which the high-speed signal lines 34 and the like of the one part of the flexible substrate 30 and the other lines 32 of the other part of the flexible substrate 30 are opposite, in order for the high-speed signal lines 34 and the like of the one part of the flexible substrate 30 to not be opposite the resistive layers 54 of the other part of the flexible substrate 30.

Figure 6:
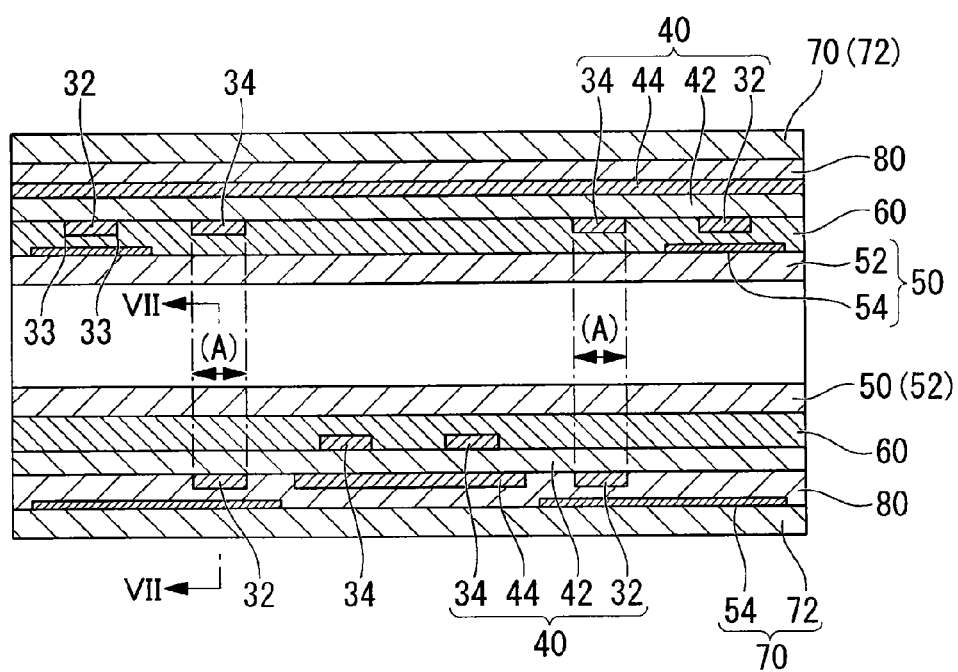
FIG. 6 is a cross-sectional view showing another example of a flexible substrate.
Figure 7:
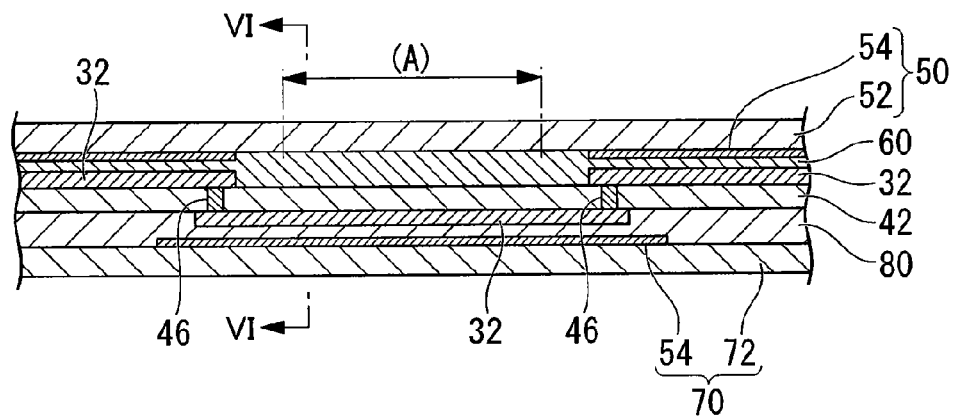
FIG. 7 is a cross-sectional view along VII-VII in FIG. 6.

Examples of other methods for weakening the influence of the resistive layer 54 include, a method in which the other lines 32 are wired to the opposite side of the base material film 42 by through holes 46 and the resistive layer 54 is provided separated from the high-speed signal lines 34 and the like as shown in FIGS. 6 and 7, and the like. When doing so, a resistive layer 54 may be formed on the second coverlay film 70.

Also, considering the above-mentioned mechanism of conduction noise suppression, it is preferable for the resistive layers 54 to be opposite near the edge sections 33 of the other lines 32.

Furthermore, in order for the resistive layers 54 to be opposite near the edge section 33 of the other lines 32, it is preferable for the resistive layers 54 to be provided conformal with the surface shape of the other lines 32 (in other words, so as to follow the surface shape of the substrate body 40).

Also, considering the above-mentioned mechanism of conduction noise suppression, it is preferable that the gap between the resistive layers 54 and the other lines 32 (in other words, thickness of the adhesive layer 60) is narrow. Specifically, the gap between the resistive layers 54 and the other lines 32 is preferably 1 to 100 μm. When the gap between the resistive layers 54 and the other lines 32 is less than 1 μm, there is the possibility that insulation trouble occurs between the resistive layers 54 and other lines 32. When the gap between the resistive layers 54 and the other lines 32 exceeds 100 μm, the conduction noise-suppressing effects decrease and the flexible substrate 30 becomes thicker.

Furthermore, considering the above-mentioned mechanism of noise suppression, the effective area of the resistive layers 54 receiving the magnetic flux arising from the edge sections 33 of the other lines 32 is preferably large. Thus, the width of the resistive layer 54 is preferably larger than the width of the other lines 32. Specifically, the width of the resistive layers 54 sticking out from the other lines 32 is preferable 0.1 mm or more, more preferably 0.5 mm or more, and even more preferably 1.0 mm. When such width is 0.1 mm or more, the magnetic flux can be sufficiently received effectively and overcurrent can be sufficiently generated. The upper limit of such width is determined according to the size of the flexible substrate 30. The frequency of the conduction noise is 1 GHz or more and, since conduction noise becomes easier to concentrate on the edge sections 33 the higher the frequency of the conduction noise becomes, conduction noise can be effectively suppressed even if such width is small.

Figure 8:
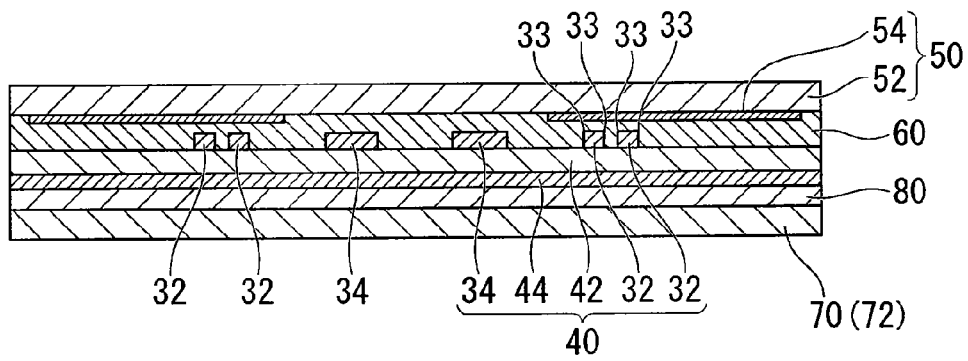
FIG. 8 is a cross-sectional view showing another example of a flexible substrate.
Figure 9:
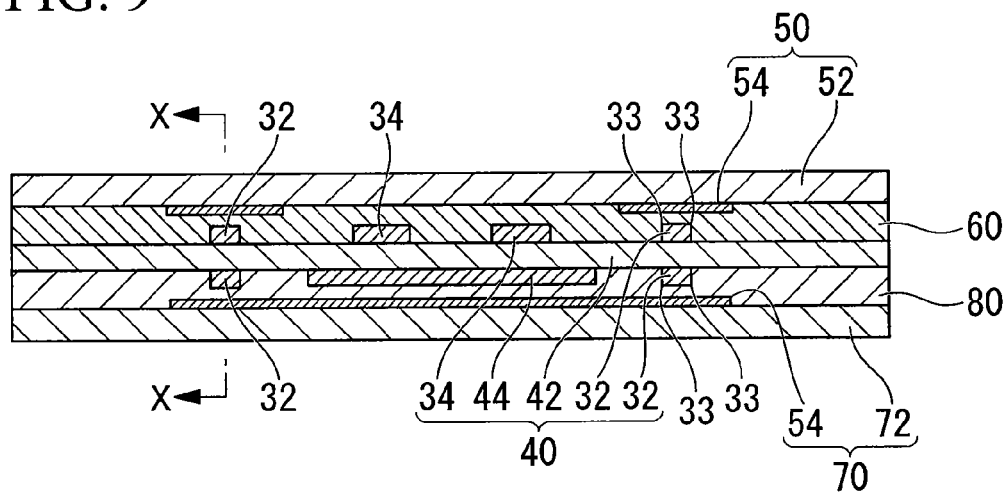
FIG. 9 is a cross-sectional view showing another example of a flexible substrate.
Figure 10:
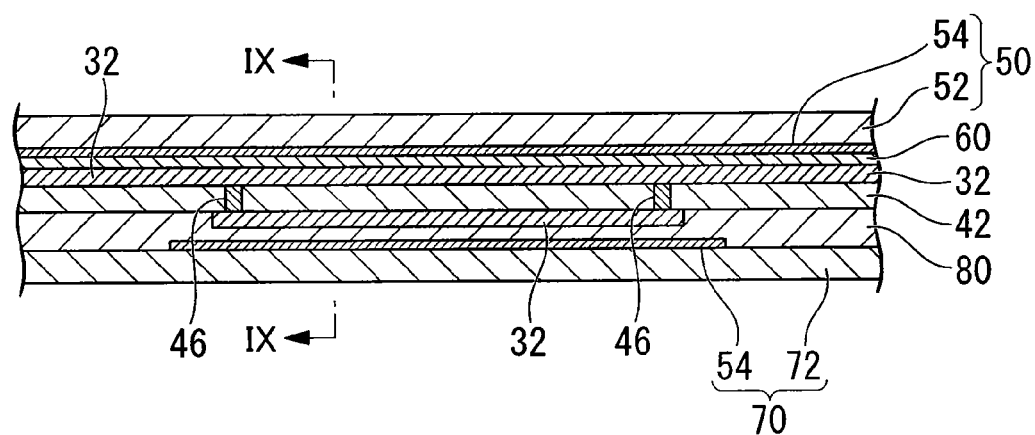
FIG. 10 is a cross-sectional view along X-X in FIG. 9.

Also, considering the above-mentioned mechanism of noise suppression, in order to effectively suppress conduction noise particularly when the area of the resistive layers 54 not placed opposite is increased, it is preferable to increase the position causing variation of the magnetic flux density in the other lines 32, in other words, increase the number of edge sections 33. For example, as shown in FIG. 8, it is preferable to divide one other line 32 midway into a plurality of lines. Also, as shown in FIGS. 9 and 10, it is possible to increase the number of edge sections 33 by providing other lines 32 also on the opposite side of the base material film 42.

Figure 11:
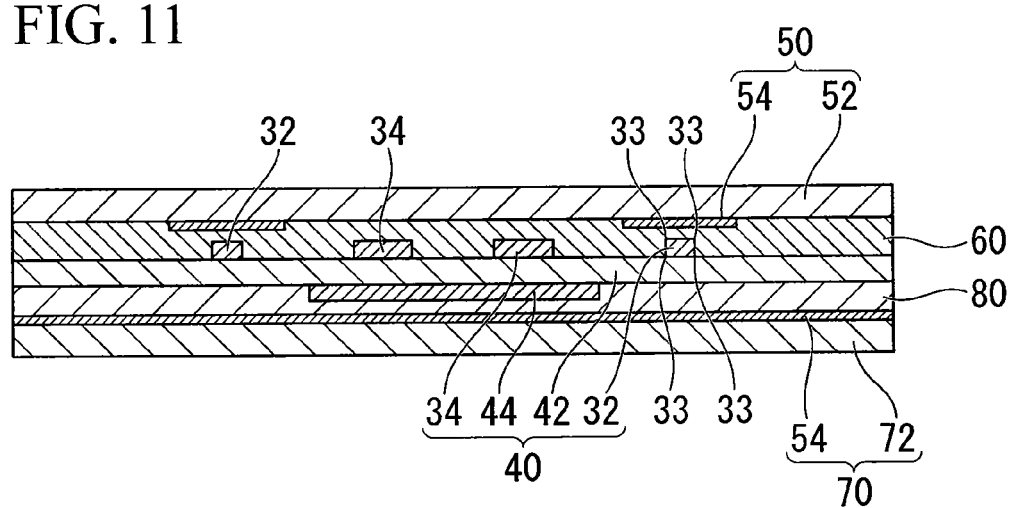
FIG. 11 is a cross-sectional view showing another example of a flexible substrate.
Figure 12:
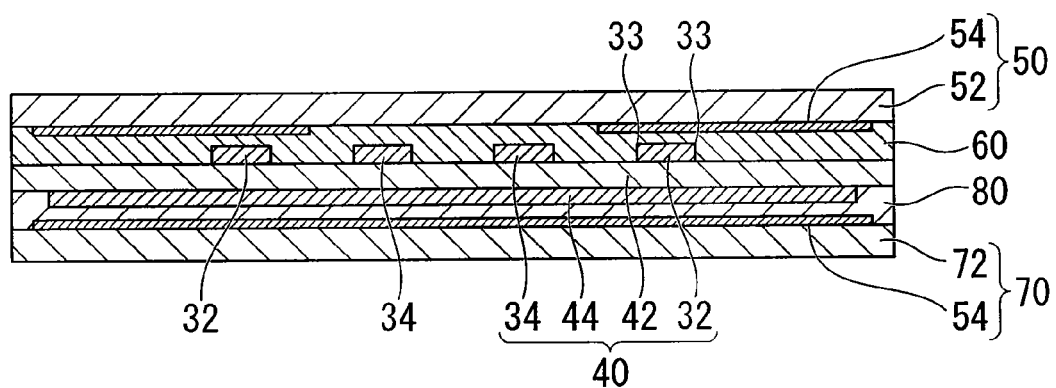
FIG. 12 is a cross-sectional view showing another example of a flexible substrate.

Furthermore, as shown in FIG. 11, magnetic flux arising from the edge sections 33 of the other lines 32 can be effectively received by providing resistive layers 54 so as to sandwich the other lines 32.

Moreover, the number of edge sections 33 may be increased by forming a plurality of irregularities on the surface of the other lines 32 and by roughening the surface.

Also, there are situations when unnecessary high-frequency current does not only flow into the other lines 32, but also into the ground layer 44. Thus, as shown in FIGS. 9 to 11 and 12, the resistive layers 54 may be separated from the ground layer 44 via the adhesive layer 80 and may be placed opposite near to the ground layer 44 by following the ground layer 44.

The resistive layers 54 are preferably not exposed on the exterior of the flexible substrate 30. When the resistive layers 54 are exposed on the exterior from a side surface and the like of the flexible substrate 30, there is the possibility that problems such as deterioration in the resistive layers 54, migration of the material forming the resistive layers 54, and the like result.

The surface resistance of the resistive layers 54 is preferably 5 to 500Ω. When the surface resistance of the resistive layers 54 is less then 5Ω, it is difficult to obtain sufficient ohmic dissipation even if overcurrent is generated and thus, the conduction noise-suppressing effects decrease. When the surface resistance of the resistance layer 54 exceeds 500Ω, it is difficult to generate overcurrent and thus, it is difficult to effectively suppress conduction noise.

Examples of the material of the resistive layers 54 include a metal, a conductive ceramic, and a carbon material.

When the specific resistance of the material is low, although the surface resistance can be adjusted so as to be high by making the resistive layers 54 thin, a material having a comparatively high specific resistance is preferable as the material of the resistive layers 54 since thickness control becomes difficult.

Examples of the metal include a ferromagnetic metal, a paramagnetic metal, and the like.

Examples of the ferromagnetic metal include: iron, carbonyl iron, iron alloys (Fe—Ni, Fe—Co, Fe—Cr, Fe—Si, Fe—Al, Fe—Cr—Si, Fe—Cr—Al, Fe—Al—Si, Fe—Pt, and the like), cobalt, nickel, alloys thereof, and the like.

Examples of the paramagnetic metal include gold, silver, copper, tin, lead, tungsten, silicon, aluminum, titanium, chromium, tantalum, molybdenum, alloys thereof, amorphous alloys thereof, alloys thereof with a ferromagnetic metal, and the like.

From the point of having resistance to acidification, nickel, an iron chromium alloy, tungsten, chromium, or tantalum is preferable as the metal. Practically, nickel, a nickel chromium alloy, an iron chromium alloy, tungsten, chromium, or tantalum is more preferable, and nickel or a nickel alloy is particularly preferable.

Examples of the conductive ceramic include alloys, intermetallic compounds, solid solutions, and the like, composed of a metal and at least one element selected from the group consisting of boron, carbon, nitrogen, silicon, phosphorus, and sulfur. Specific examples thereof include nickel nitride, titanium nitride, tantalum nitride, chromium nitride, titanium carbide, silicon carbide, chromium carbide, vanadium carbide, zirconium carbide, molybdenum carbide, tungsten carbide, chromium boride, molybdenum boride, chromium silicide, zirconium silicide, and the like.

The conductive ceramic can be easily obtained by using, as the reactive gas in a physical deposition method, a gas including at least one element selected from the group consisting of nitrogen, carbon, silicon, boron, phosphorus and sulfur.

Examples of the carbon material include amorphous carbon, graphite, DLC (diamond-like carbon), and the like.

The resistive layers 54 are formed by processing a resistive vapor-deposited film formed on the surface of a base material film 52 by a physical vapor deposition method (EB vapor deposition method, ion beam vapor deposition method, sputtering method, or the like) so as to have a desired pattern by a well-known wet method (wet etching method), dry method (plasma etching method or laser ablation method), or the like.

From the point of transmissibility, the thickness of the resistive layers 54 is preferably 5 to 50 nm.

(Adhesive Layers)

The adhesive layer 60 and the adhesive layer 80 are hardened or solidified commercially available adhesive sheets (bonding sheets) for example. When the adhesive layers are formed by coating a coverlay film with a wet adhesive and drying like conventionally, there are problems such as (i) the coverlay film on which a patterned resistive layer is formed curls and thus, positioning thereafter becomes difficult, (ii) positioning accuracy decreases as a result of the patterning dimensions varying by heat, (iii) deterioration of the resistive layers is promoted, and the like. In order to avoid such problems, using a dry adhesive sheet is preferable and furthermore, adhesion processing can be carried out very simply by being able to directly carry out laminate pressing with the substrate body 40 after the resistive layers have been etched.

Examples of the material of the adhesive sheets include B-stage (semi-cured state) epoxy resins, thermoplastic polyimide, and the like. The epoxy resins may include rubber components (Carboxyl-modified nitrile rubber, and the like.) for giving transmissibility.

The adhesive sheets are formed by casting the above-mentioned material on a mold-releasing film or the like so as to have a desired thickness and then may be made into a continuous sheet by removing the mold-releasing film or the like, or may by stored with the mold-releasing film or a protection film.

The adhesive layers preferably include an insulating powder or powders as a spacer in order to increase insulation between the resistive layer 54 and the conductors. Such powder or powders may have other functions such as flow control and flame retardancy. Examples of such powder or powders include magnesium hydroxide, aluminum hydroxide, antimony oxide, zinc stannate, zinc borate, silicon oxide, titanium oxide, zeolites, fibrous powders (calcium carbonate whiskers, zinc oxide whiskers, aluminum borate whiskers, potassium titanate whiskers, and the like), and the like. It is possible to effectively orientate and retain the powder on the edge sections 33 of the other line 32 by flowability of the adhesive layer as a result of using a powder or powders among these having an aspect ratio of 3 or above, which is preferable.

The diameter of the insulating powder or powders is preferably ½ to ¹/₂₀ of the thickness of the adhesive layers. When smaller than this, it is difficult to achieve the function of an insulating spacer and when bigger than this, there is the possibility that adhesion inhibition results.

The content of the insulating powder or powders is about 1 to 30 parts by mass in 100 parts by mass of the adhesive layers. When less than this, sufficient insulation is not achieved and when more than this, adhesion inhibition results as well as problems in conformability to the surface shape are caused.

The thickness of the adhesive layers is preferably 1 to 100 μm. Also, the thickness of the adhesive layer 60 is preferably less than the thickness of the other lines 32 in order for the resistive layers 54 to be provided so as to follow the surface shape of the substrate body 40.

Wetting of the resistive layer 54 is by melting of the adhesive layer 60, and adhesive power is insufficient since such has a higher viscosity than an adhesive including a solvent and thus, does not wet well. Therefore, it is preferable to coat the resistive layers 54 with an adhesion-promoting agent such as a silane coupling agent, a titanate coupling agent, or the like.

Examples of the silane coupling agent include vinyl triethoxy silane, vinyl tris(2-methoxyethoxy)silane, 3-methacryloxy propyl trimethoxy silane, 3-glycidoxy propyl trimethoxy silane, 2-(3,4-epoxy cyclohexyl)ethyl trimethoxy silane, N-2-(aminoethyl)3-amino propyl trimethoxy silane, N-2-(aminoethyl)3-aminopropyl methyl dimethoxy silane, 3-aminopropyl triethoxy silane, N-phenyl-3-aminopropyl trimethoxy silane, 3-mercaptopropyl trimethoxy silane, 3-chloropropyl trimethoxy silane, and the like.

Examples of the titanate coupling agent include isopropyl triisostearoyl titanate, isopropyl tris(dioctyl pyrophosphate) titanate, isopropyl tri(N-aminoethyl-aminoethyl) titanate, tetraoctylbis(di-tridecyl phosphate) titanate, bis(dioctyl pyrophosphate) oxyacetate titanate, bis(dioctyl pyrophosphate) ethylene titanate, isopropyl trioctanoyl titanate, isopropyl dimethacryl isostearoyl titanate, isopropyl isostearoyl diacryl titanate, tetraisopropyl bis(dioctyl phosphate) titanate, and the like.

With respect to the flexible substrate 30 explained above, since the resistive layers 54 are placed opposite and spaced apart from the other lines 32 (or ground layer 44) by the adhesive layer 60 (or adhesive layer 80), conduction of conduction noise in the other lines 32 (or ground layer 44) can be inhibited for the following reason.

It is considered that when electromagnetic noise is emitted from the other lines 32 (or ground layer 44) and electromagnetic field fluctuation around the other lines 32 (or ground layer 44), in other words, variation in the magnetic flux density resulting from the other lines 32 (or ground layer 44) occurs, eddy current is generated in the resistive layers 54 placed opposite so as to prevent variation in this magnetic flux density, energy is consumed by ohmic dissipation, and conduction noise flowing in the other lines 32 (or ground layer 44) is attenuated.

Examples are disclosed below. However, the present invention is not limited to these examples.

(Thickness of Each Layer)

The thickness was measured at five points of each layer by observing the cross section of a sample using a transmission electron microscope (H9000NAR manufactured by Hitachi, Ltd.) and the measured values were averaged.

(Surface Resistance)

Using two thin-film metal electrodes (length: 10 mm, width: 5 mm, distance between electrodes: 10 mm) formed by vapor-depositing metal on silica glass, the object to be measured was placed on such electrodes, a 50 g load was pressed onto a 10 mm×20 mm region of the object to be measured from above the object to be measured, and the resistance between the electrodes at a measurement current of 1 mA or less was measured. This value is the surface resistance.

(Conduction Noise-Suppressing Effects)

The S-parameter between both ends of the other lines 32 of the flexible substrate 30 were evaluated by a network analyzer (37247D manufactured by Anritsu Company) and the conduction noise-suppressing effects were confirmed.

Also, the S-parameter was measured between adjacent high-speed signal lines 34 and other lines 32, and the influence of crosstalk was confirmed.

EXAMPLE 1

One surface of a double-sided copper-clad laminate (200 mm×200 mm, thickness 86 µm) comprising a polyimide film having a thickness of 25 µm, a rolled copper foil having a thickness of 18 µm, and an epoxy adhesive was processed by an etching method to form four conductors (high-speed signal lines 34 and other lines 32) like in FIG. 5 having a line width of 0.1 nun and a thickness of 9 mm. Land parts having a diameter of 2 mm were formed on both ends of the conductors so that coaxial lead lines for measurement can be soldered. The other surface of above-mentioned double-sided copper-clad laminate was processed by an etching method to form a 15 mm×6 mm ground layer 44, thus preparing the substrate body 40.

To the entire surface of a 200 mm×200 mm×10 µm thick polyimide film, nickel was physically vapor-deposited by a magnetron sputtering method under the flow of nitrogen gas to form a nickel nitride vapor-deposited film having a thickness of 25 nm (surface resistance: 25Ω). By a laser ablation method, such vapor-deposited film formed resistive layers 54 which cover the other lines 32 excluding an upper part of the other lines 32 as shown in FIG. 5, thus preparing the first coverlay film 50.

A polyimide film the same as the first cover layer film was prepared and this is the second coverlay film 70.

200 mm×200 mm×20 µm thick bonding sheets (Those which are in the form of a B-stage which has been dried after forming a film of an epoxy adhesive comprising an epoxy resin including a rubber component and a latent curing agent, and include 5 parts by mass of silica particles having an average particle diameter of 5 µm and 3 parts by mass of calcium carbonate having an average fiber diameter of 1 µm and an average fiber length of 20 µm as insulating particles.) were partially heated and adhered to the surface of the first coverlay film 50 on the side on which the resistive layer 54 is formed and the surface of the second coverlay film 70. Window parts for avoiding the land parts were formed on the first coverlay film 50 and the second coverlay film 70 on which the bonding sheets are temporarily joined by punching.

The first coverlay film 50 to which a bonding sheet is temporarily joined was overlapped on the surface of substrate body 40 on the side on which the high-speed signal lines 34 and the other lines 32 are formed so that the bonding sheet is positioned between the substrate body 40 and the first coverlay film 50, and so that the resistive layer 54 and the other lines 32 (excluding the land part) are placed opposite each other. Also, the second coverlay film 70 to which a bonding sheet is temporarily joined was overlapped on the surface of the substrate body 40 on the side on which the ground layer 44 is formed so that the bonding sheet is positioned between the substrate body 40 and the second coverlay film 70.

These were integrated by a heat press to obtain the flexible substrate 30. The resistive layer 54 was opposite the edge sections 33 near the other lines 32 in the flexible substrate 30. Also, the resistive layers 54 were completely covered by the coverlay films and was not exposed on the exterior of the flexible substrate 30.

Figure 13:
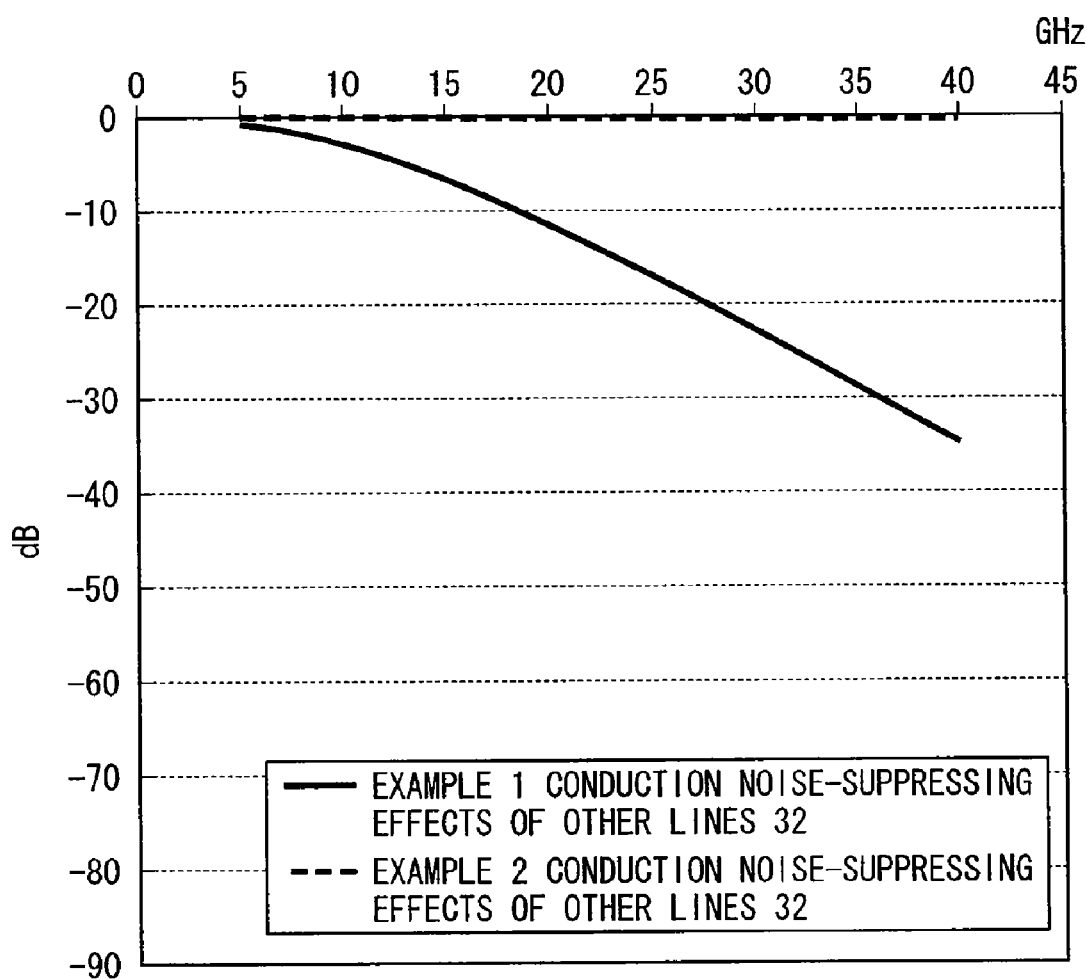
FIG. 13 is a graph showing the conduction noise-suppressing effects of other lines 32 in Examples 1 and 2.
Figure 14:
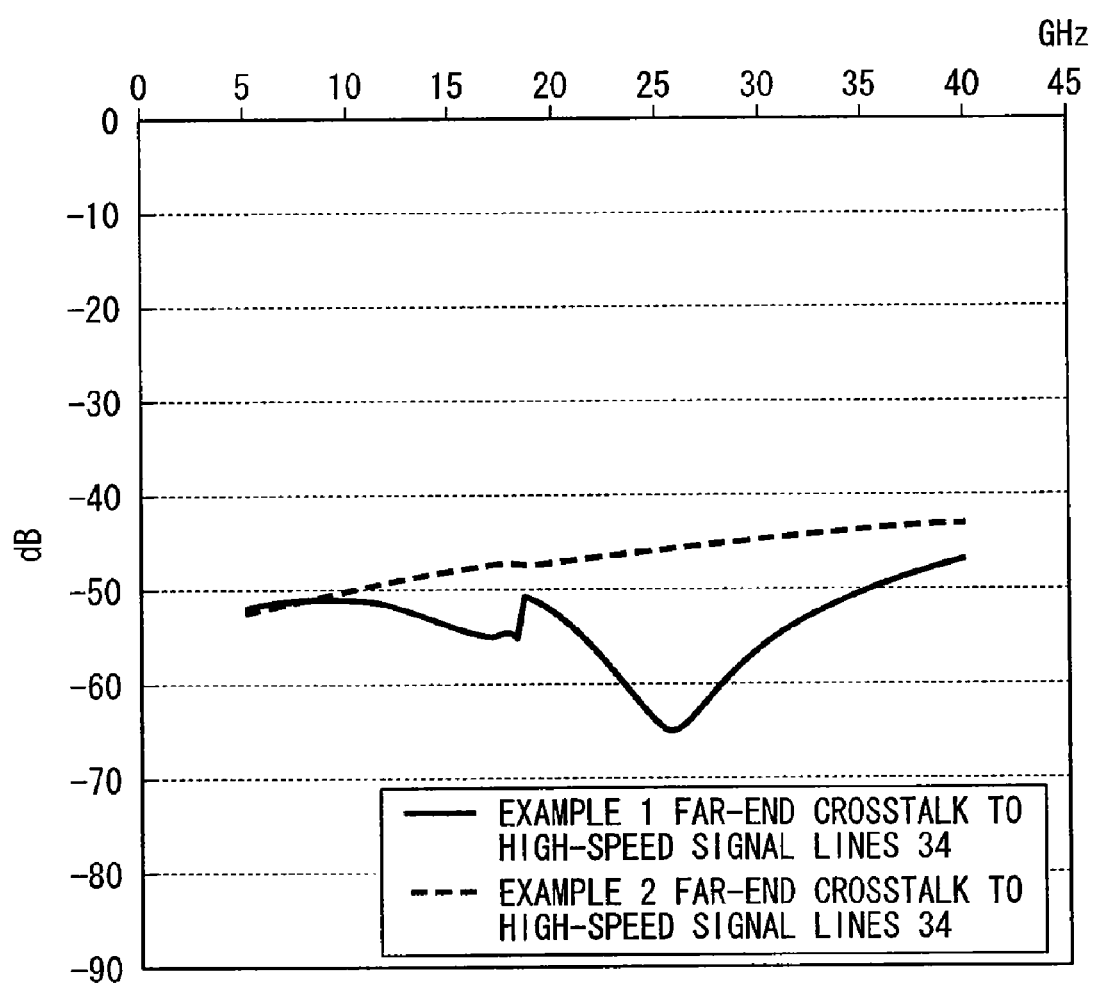
FIG. 14 is a graph showing the far-end crosstalk to high-speed signal lines 34 in Examples 1 and 2.
Figure 15:
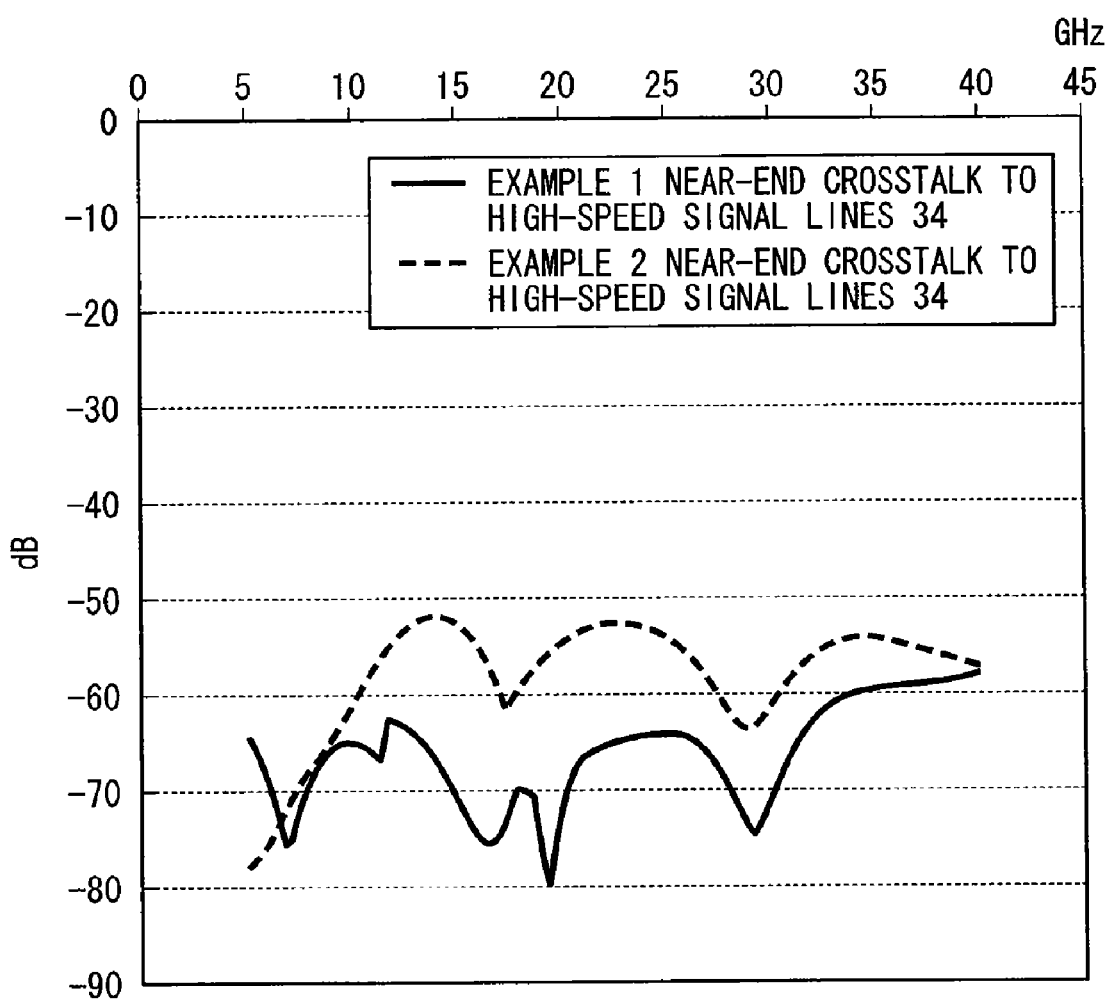
FIG. 15 is a graph showing the near-end crosstalk to the high-speed signal lines 34 in Examples 1 and 2.

With respect to the flexible substrate 30, coaxial lead lines for measurement were soldered to the land parts, and after being connected to the network analyzer, the S-parameter of the adjacent high-speed signal line 34 and other lines 32 was measured. The conduction noise of the other lines 32 having high-frequency noise was suppressed and there was no effect on adjacent high-speed signal lines 34. The results are shown in FIGS. 13 to 15.

EXAMPLE 2

Other than not providing resistive layers, a flexible substrate was produced the same as Example 1 and evaluated the same as Example 1. The conduction noise of the other lines 32 having high-frequency noise was not suppressed and had an effect on adjacent high-speed signal lines 34. The results are shown in FIGS. 13 to 15.

The optical transceiver of the present invention is useful as an optical transceiver module used in a 10 Gbps optical transmission interface or 40 Gbps optical transmission interface.

What is claimed is:

1. An optical transceiver of the present invention comprising:
   an optical sub-assembly;
   a circuit board; and
   a flexible substrate connecting the optical sub-assembly and the circuit board,
   wherein the flexible substrate comprises, provided spaced apart from each other, high-speed signal lines for transmitting a high-frequency signal, lines other than the high-speed signal lines, a ground layer, and resistive layers,
   the resistive layers are opposite at least a part of the lines other than the high-speed signal lines, and
   the resistive layers are not opposite the high-speed signal lines.

2. The optical transceiver according to claim 1, wherein the flexible substrate is arranged so as to be folded back midway, and the high-speed signal lines of the part of the flexible substrate folded back and opposite is not opposite the resistive layers of a part of the flexible substrate which is not folded back and opposite.

3. The optical transceiver according to claim 1, wherein the resistive layers are opposite near edge sections of the lines other than the high-speed signal lines.

4. The optical transceiver according to claim 1, wherein the lines other than the high-speed signal lines are divided into a plurality of wires in parts opposite the resistive layers.

* * * * *